(12) United States Patent
Liao et al.

(10) Patent No.: US 9,391,107 B1
(45) Date of Patent: Jul. 12, 2016

(54) IMAGE SENSOR

(71) Applicant: Powerchip Technology Corporation, Hsinchu (TW)

(72) Inventors: Chi-Ching Liao, New Taipei (TW); Hung-Tai Lai, Hsinchu (TW); Shyng-Yeuan Che, Hsinchu County (TW); S-I Chan, Hsinchu (TW)

(73) Assignee: Powerchip Technology Corporation, Hsinchu Science Park, Hsinchu (TW)

( * ) Notice: Subject to any disclaimer, the term of this patent is extended or adjusted under 35 U.S.C. 154(b) by 0 days.

(21) Appl. No.: 14/698,873

(22) Filed: Apr. 29, 2015

(30) Foreign Application Priority Data

Apr. 9, 2015 (TW) .............................. 104111481 A

(51) Int. Cl.
*H01L 27/146* (2006.01)

(52) U.S. Cl.
CPC ...... *H01L 27/1463* (2013.01); *H01L 27/14621* (2013.01); *H01L 27/14627* (2013.01); *H01L 27/14643* (2013.01); *H01L 27/14685* (2013.01)

(58) Field of Classification Search
USPC .......................... 257/446, 252–254, 257/258, 257/E51.018–E51.022, E33.001–E33.077, 257/E33.054, E25.032, 219, 225, 239, 240, 257/241–246, E27.082–E27.083, E27.15, 257/E29.065, E29.24; 438/22–47, 69, 493, 438/503, 507, 956, 60, 75, 144, 70, 73, 438/E31.127, E31.032, 59, E31.097, 438/E27.13

See application file for complete search history.

(56) References Cited

U.S. PATENT DOCUMENTS

| | | | | |
|---|---|---|---|---|
| 2013/0200478 A1* | 8/2013 | Toyoda | ............. | H01L 27/14627 257/432 |
| 2014/0035082 A1* | 2/2014 | Chu | ................... | H01L 27/1463 257/432 |
| 2014/0263962 A1* | 9/2014 | Ahn | .................. | H01L 27/14618 250/208.1 |
| 2015/0054110 A1* | 2/2015 | Kashihara | ........ | H01L 27/14636 257/435 |
| 2015/0279880 A1* | 10/2015 | Jangjian | ............. | H01L 27/1464 257/447 |

* cited by examiner

*Primary Examiner* — Dao H Nguyen
*Assistant Examiner* — Tram H Nguyen
(74) *Attorney, Agent, or Firm* — Winston Hsu; Scott Margo

(57) ABSTRACT

An image sensor device includes a substrate having an active array region and a peripheral circuit region, a plurality of light-sensing elements disposed within the active array region, a first dielectric layer on the substrate, and a second dielectric layer on the first dielectric layer. A recess region is provided in the second dielectric layer to reveal a top surface of the first dielectric layer within the active array region. An angle between a sidewall of the second dielectric layer that defines the perimeter of the recess region and the top surface of the first dielectric layer is less than 90 degrees.

12 Claims, 7 Drawing Sheets

IMAGE SENSOR

CROSS REFERENCE TO RELATED APPLICATION

This application claims the benefit of Taiwan patent application No. 104111481, filed on Apr. 9, 2015, the disclosure of which is incorporated herein in its entirety by reference.

BACKGROUND OF THE INVENTION

1. Field of the Invention

The present invention relates generally to an image sensor device and, more particularly, to a CMOS image sensor (CIS) device and a fabrication method thereof.

2. Description of the Prior Art

CMOS image sensors are known in the art. A CMOS image sensor typically includes active components, such as transistors, which are associated with each pixel. Because of the compatibility with the CMOS process, an advantage is the ability to integrate signal processing circuit and sensing circuit within a single chip.

A CMOS image sensor unit is generally composed of several transistors and a photodiode. Incident light is divided into light of different wavelengths, such as red, blue, and green, and received by the photodiode in semiconductor substrate, which is then converted into electrical signals.

FIG. 1 is a schematic, cross-sectional view of a prior art CMOS image sensor. As shown in FIG. 1, the prior art CMOS image sensor includes a semiconductor substrate 10. A plurality of photosensor elements 110 is provided within an active array region 101 on the semiconductor substrate 10. A first dielectric layer 12, a second dielectric layer 14, and a third dielectric layer 16 are deposited on the semiconductor substrate 10. The first dielectric layer 12 covers the photosensor elements 110 in the active array region 101 and transistors 120 in the peripheral circuit region 102. The second dielectric layer 14 covers the metal interconnection layer 140 on the first dielectric layer 12. The third dielectric layer 16 covers the metal interconnection layer 160 on the second dielectric layer 14.

In order to reduce the light loss, after the deposition of the third dielectric layer 16, a photoresist pattern 18 is typically formed on the third dielectric layer 16. A so-called "canyon etching" process is then carried out to etch the exposed third dielectric layer 16 within the active array region 101 to a pre-selected depth through the opening 18a of the photoresist pattern 18. The "canyon etching" process does not etch through the entire thickness of the third dielectric layer 16 and the underlying second dielectric layer 14 is not exposed. After the "canyon etching" process, a recess region 21 is formed in the third dielectric layer 16, which is directly situated above the active area region 101.

However, the above-described prior art has some drawbacks. For example, due to the loading effect during the "canyon etching" process, an angle $\theta_1$ between the sidewall 21a and the bottom 21b of the recess region 21 is typically greater than 90 degrees, as indicated by the broken line circle 20. Before light incident into the photosensor element 110a that is situated near the perimeter of the active array region 101, it passes through a thicker third dielectric layer 16 than light passing through the center of the active array region 101. This results in significant brightness difference between the center and four corners of an image.

SUMMARY OF THE INVENTION

It is therefore one object of the invention to provide an improved CMOS image sensor and a fabrication method of making the same in order to solve the above-described prior art problems and shortcomings.

According to one embodiment of the invention, an image sensor includes a semiconductor substrate having an active array region and a peripheral circuit region thereon; a plurality of photosensor elements in the active array region of the semiconductor substrate; a first dielectric layer on the semiconductor substrate covering the active array region and the peripheral circuit region; and a second dielectric layer on the first dielectric layer. The second dielectric layer has a recess region within the active array region. The recess region exposes a top surface of the first dielectric layer. A perimeter of the recess region is defined by a sidewall of the second dielectric layer. An angle between the sidewall of the second dielectric layer and the top surface of the first dielectric layer is less than 90 degrees.

According to one embodiment of the invention, the first and second dielectric layers are both composed of a silicon oxide layer.

According to one embodiment of the invention, a first metal interconnection layer is disposed on the semiconductor substrate, and the first dielectric layer covers the first metal interconnection layer. A second metal interconnection layer is disposed on the first dielectric layer, and the second dielectric layer covers the second metal interconnection layer. The first metal interconnection layer and the second metal interconnection layer are disposed within the peripheral circuit region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined by the appended claims.

The terms wafer and substrate used herein include any structure having an exposed surface onto which a layer is deposited according to the present invention, for example, to form the integrated circuit (IC) structure. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art.

Figure 1:
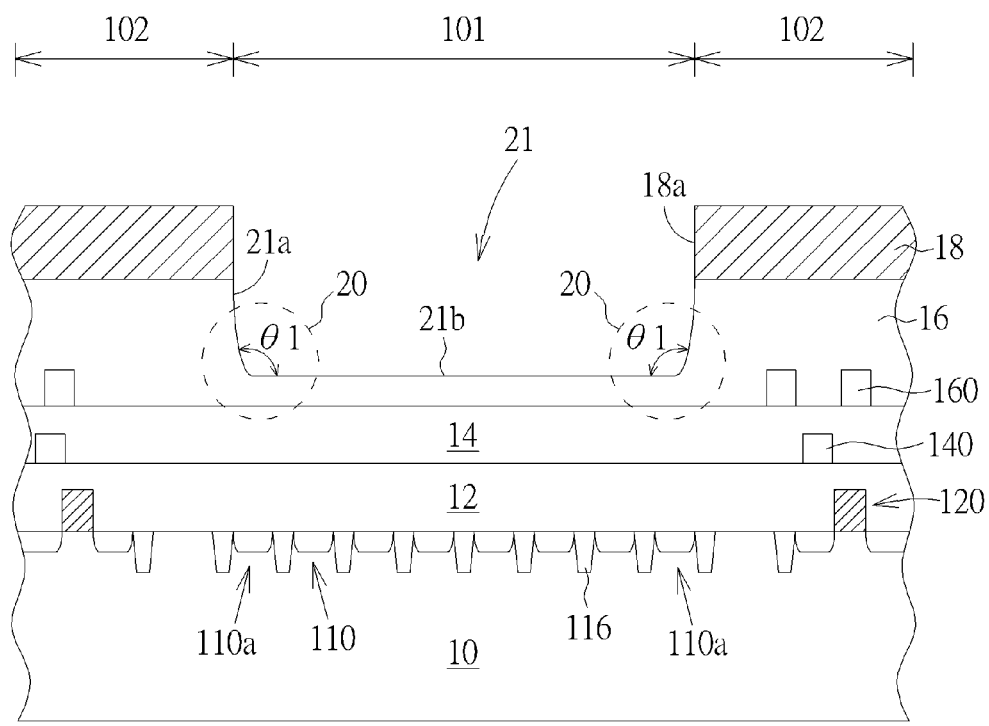
FIG. 1 is a schematic, cross-sectional view of a prior art CMOS image sensor.
Figure 2:
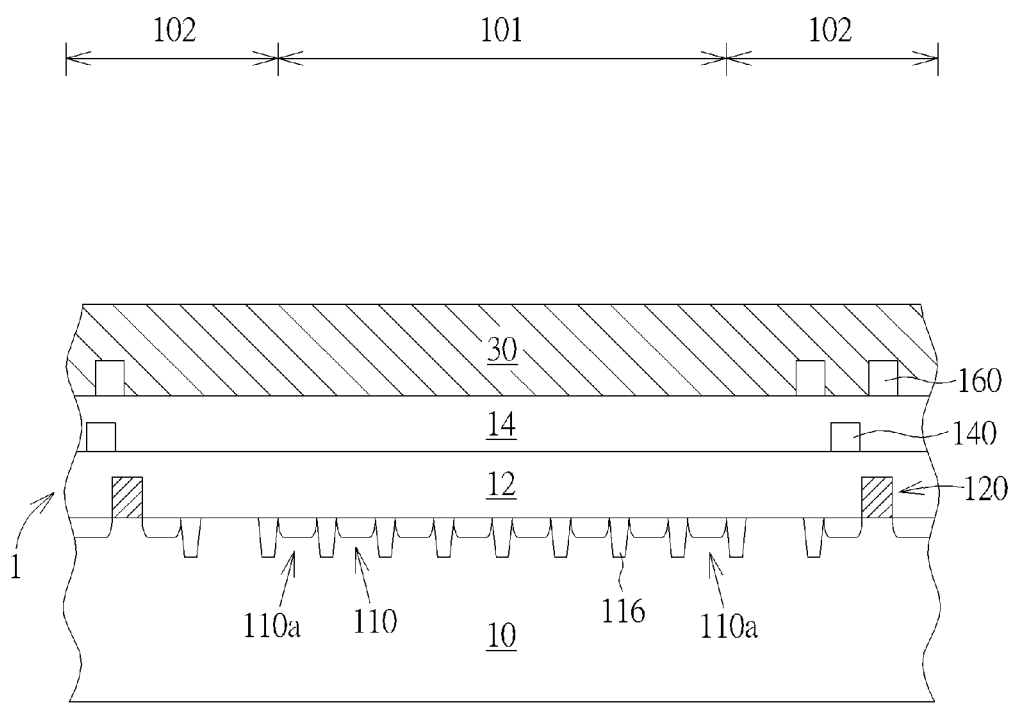
FIG. 2 to FIG. 6 illustrate an exemplary method for fabricating an improved CMOS image sensor according to one embodiment of the invention.

Please refer to FIG. 2 to FIG. 6, which illustrate, in cross-sectional views, an exemplary method for fabricating an improved image sensor according to one embodiment of the invention, wherein like numeral numbers designate like regions, layers, and elements. As shown in FIG. 2, the image sensor 1 comprises a semiconductor substrate 10. A plurality of photosensor elements 110 such as photodiode elements is provided within an active array region 101 on the semiconductor substrate 10. The photosensor elements 110 are isolated from one another by an isolation structure 116. According to the illustrative embodiment, the image sensor 1 may be a CMOS image sensor, but not limited thereto.

Subsequently, a dielectric layer 12 and a dielectric layer 14 are deposited on the semiconductor substrate 10. The dielectric layer 12 covers the photosensor elements 110 in the active array region 101 and the transistors 120 in the peripheral circuit region 102. The dielectric layer 14 covers the metal interconnection layer 140 on the dielectric layer 12. According to the illustrative embodiment, the dielectric layer 12 and the dielectric layer 14 are composed of transparent dielectric materials, for example, silicon oxide.

Subsequently, the metal interconnection layer 160 is formed on the dielectric layer 14. A sacrificial dielectric layer 30 is then deposited on the dielectric layer 14. According to the illustrative embodiment, the sacrificial dielectric layer 30 may be composed of silicon oxynitride, amorphous carbon, or photosensitive polymeric materials, but not limited thereto.

Figure 3:
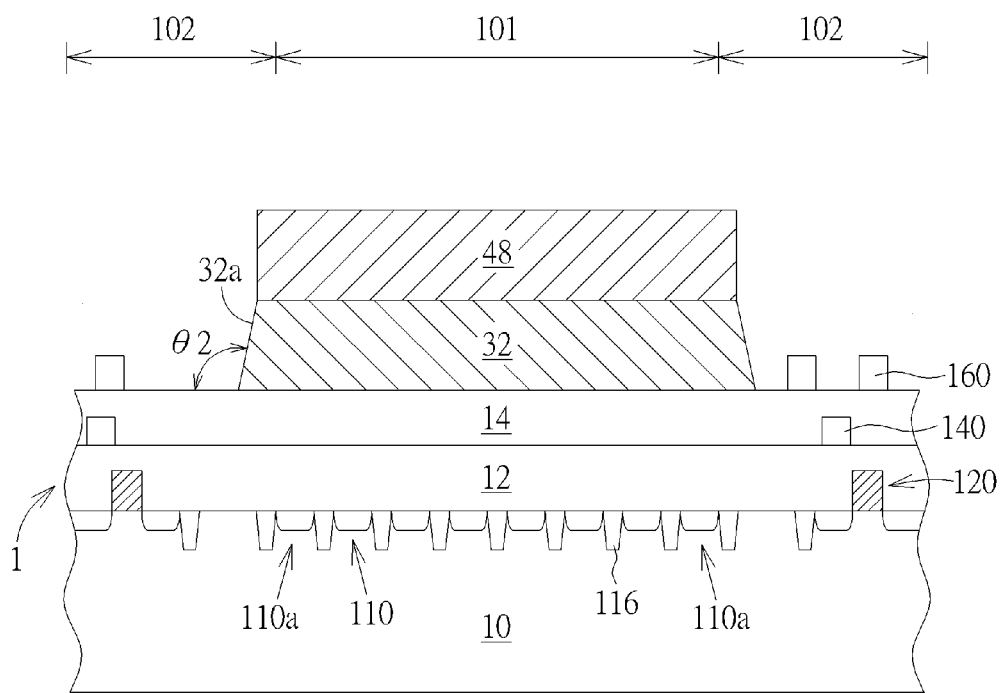

As shown in FIG. 3, a photoresist pattern 48 is formed on the sacrificial dielectric layer 30. The photoresist pattern 48 only covers the sacrificial dielectric layer 30 within the active array region 101. The sacrificial dielectric layer 30 outside the active array region 101 is exposed. Subsequently, an etching process is performed, for example, an anisotropic dry etching process. Using the photoresist pattern 48 as an etching hard mask, the exposed sacrificial dielectric layer 30 is etched away and a portion of the top surface of the dielectric layer 14 is exposed, thereby forming a sacrificial layer pattern 32.

According to the illustrative embodiment, the sacrificial layer pattern 32 has slightly inclined sidewalls 32a. According to the illustrative embodiment, an angle $\theta_2$ between the inclined sidewall 32a of the sacrificial layer pattern 32 and the top surface of the dielectric layer 14 is preferably greater than 90 degrees. The photoresist pattern 48 is then removed.

Figure 4:
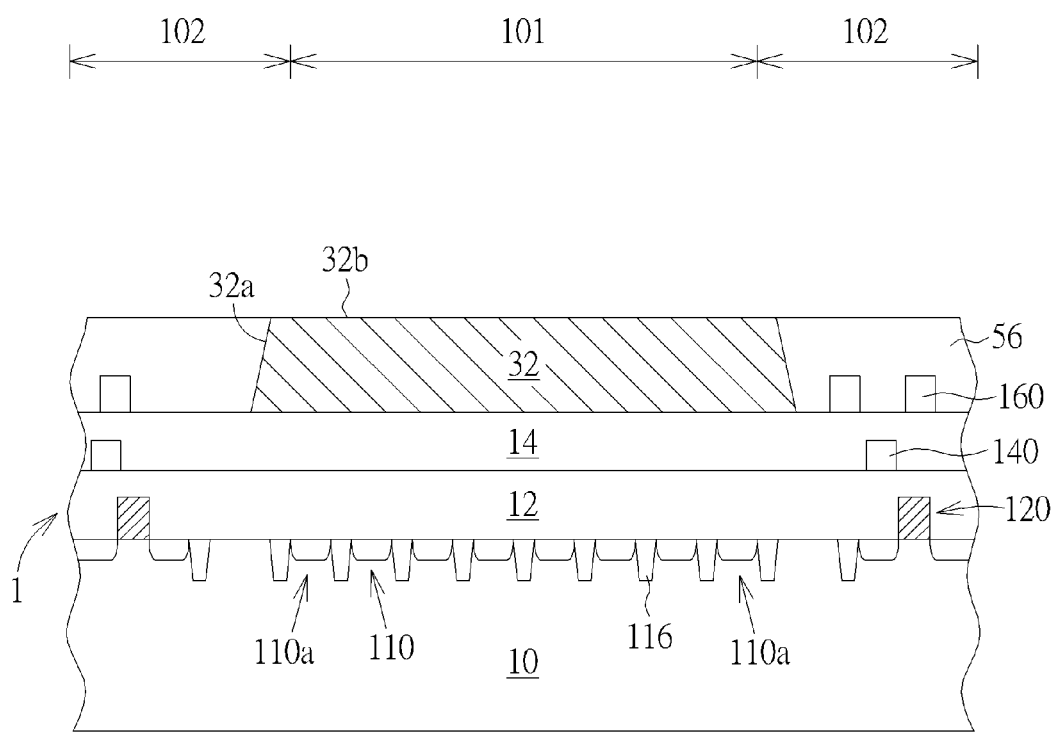

As shown in FIG. 4, a chemical vapor deposition (CVD) process is then performed, for example, atomic layer deposition (ALD) process or other suitable low-temperature CVD processes, to deposit a dielectric layer 56 such as a silicon oxide layer on the top surface of the dielectric layer 14 and on the sacrificial layer pattern 32. The dielectric layer 56 is subjected to a planarization process such as a chemical mechanical polishing (CMP) process or an etching back process, thereby revealing a top surface 32b of the sacrificial layer pattern 32.

Figure 5:
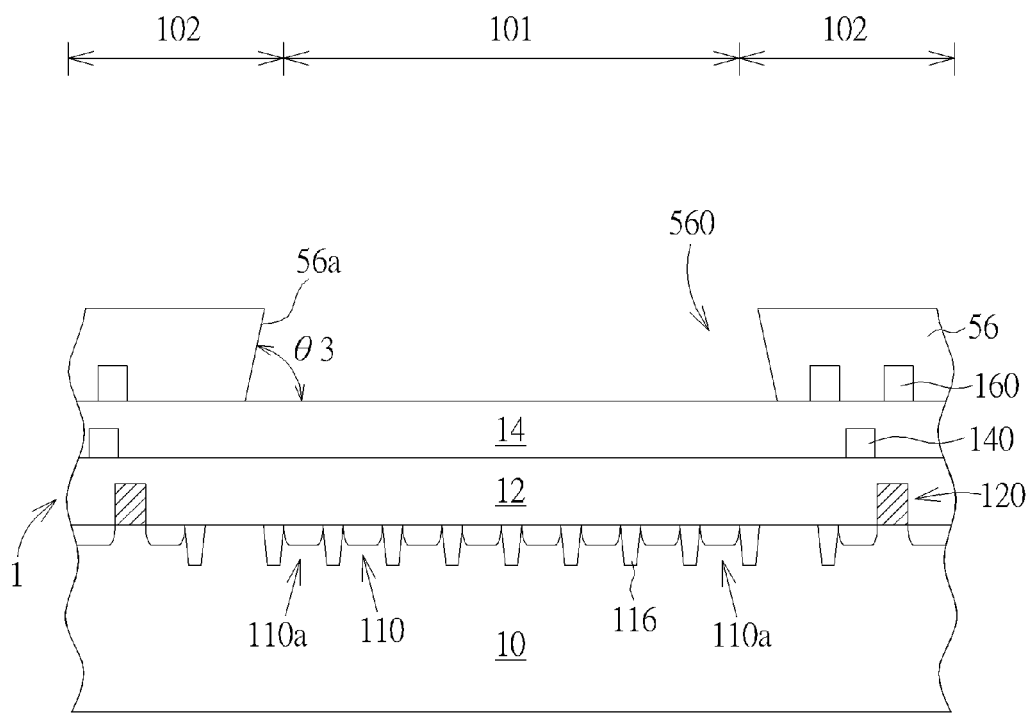

As shown in FIG. 5, the sacrificial layer pattern 32 is completely removed, thereby leaving a recess region 560 in the dielectric layer 56 and revealing a portion of the top surface of the dielectric layer 14. According to the illustrative embodiment, the perimeter of the recess region 560 is defined by the sidewalls 56a of the dielectric layer 56. According to the illustrative embodiment, an angle $\theta_3$ between the sidewall 56a and the top surface of the dielectric layer 14 is preferably less than 90 degrees.

Figure 6:
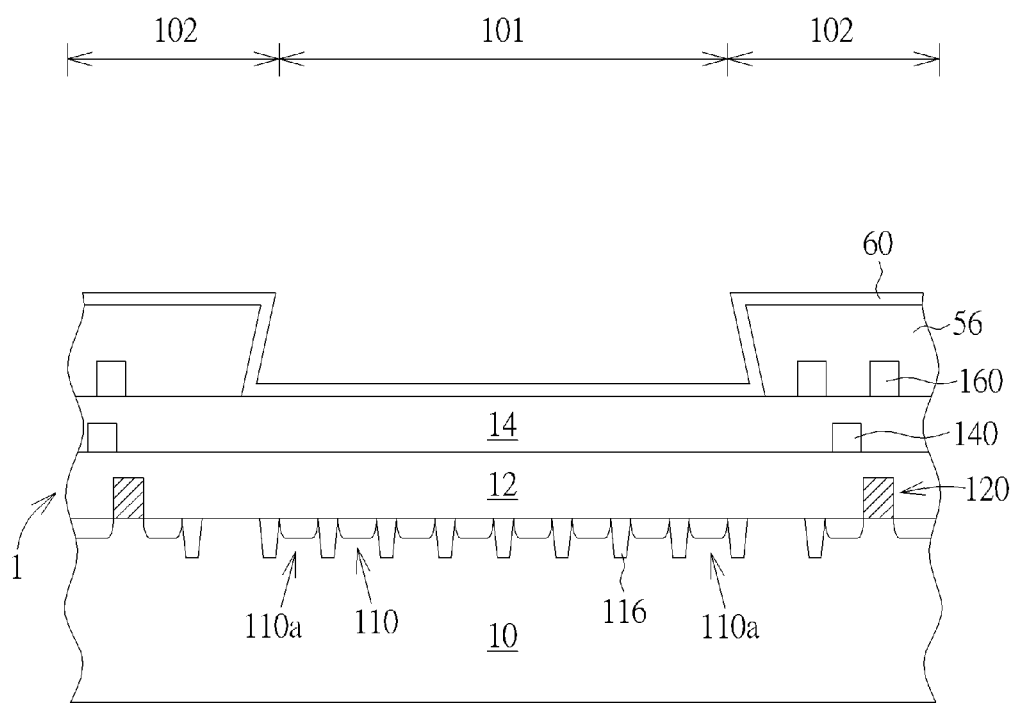

As shown in FIG. 6, after removing the sacrificial layer pattern 32, a protection layer 60 may be conformally deposited on the dielectric layer 56 and within the recess region. It is to be understood that the structure depicted in FIG. 6 is semi-finished product of the image sensor.

Figure 7:
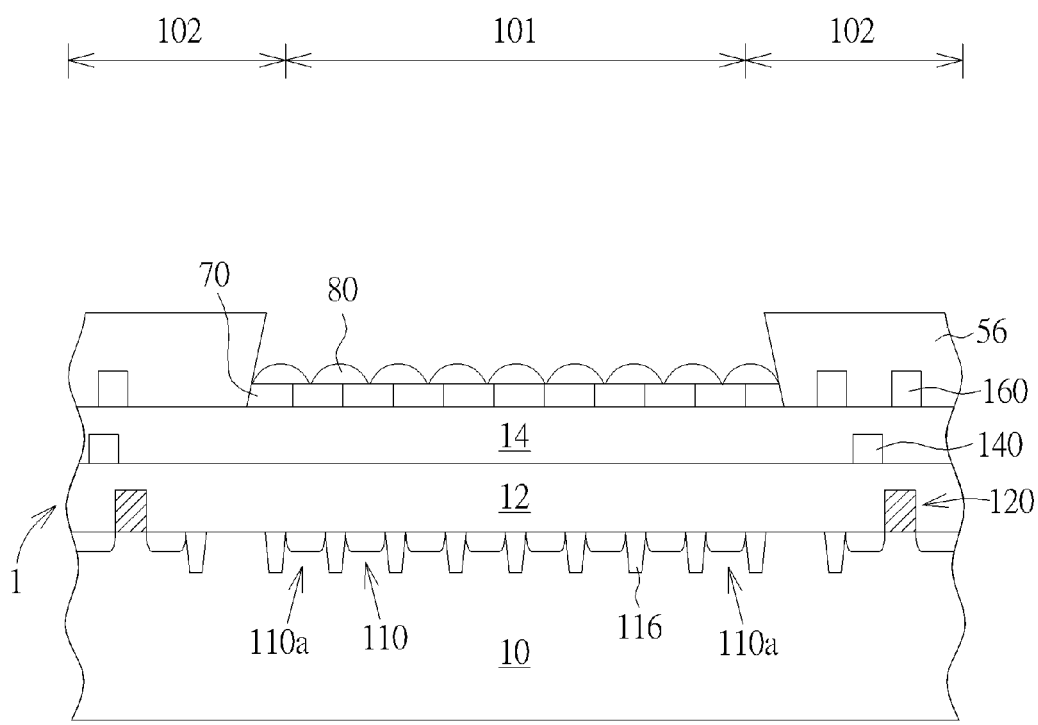
FIG. 7 is a schematic, cross-sectional view of an image sensor after forming the color filter film and the micro-lens structure according to one embodiment of the invention.

According to one embodiment of the invention, as shown in FIG. 7, a color filter film 70 and a micro-lens structure 80 may be formed on the dielectric layer 14 within the recess region 560 in a back-end of line process to complete the image sensor 1. Since the color filter film 70 and micro-lens structure 80 are well-known in the art, the details are omitted for the sake of simplicity.

It is advantageous to use the invention because the angle $\theta_3$ between the sidewall 56a of the dielectric layer 56 and the top surface of the dielectric layer 14 is less than 90 degrees. This circumvents the prior art problem caused by the so-called "canyon etching" process. Further, the top surface of the dielectric layer 14 in the recess region 560 is exposed, meaning that light passes less combined thickness of the dielectric layers, thereby improving the sensitivity of the image sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image sensor, comprising:
    a semiconductor substrate having an active array region and a peripheral circuit region thereon;
    a plurality of photosensor elements in the active array region of the semiconductor substrate;
    a first dielectric layer on the semiconductor substrate covering the active array region and the peripheral circuit region; and
    a second dielectric layer on the first dielectric layer, wherein the second dielectric layer comprises a recess region corresponding the active array region, the recess region exposes a top surface of the first dielectric layer, wherein a perimeter of the recess region is defined by a sidewall of the second dielectric layer, and wherein an angle between the sidewall of the second dielectric layer and the top surface of the first dielectric layer is less than 90 degrees.

2. The image sensor according to claim 1, wherein the first dielectric layer is a silicon oxide layer.

3. The image sensor according to claim 1, wherein the second dielectric layer is a silicon oxide layer.

4. The image sensor according to claim 1 further comprising a first metal interconnection layer on the semiconductor substrate, and the first dielectric layer covers the first metal interconnection layer.

5. The image sensor according to claim 4 further comprising a second metal interconnection layer on the first dielectric layer, and the second dielectric layer covers the second metal interconnection layer.

6. The image sensor according to claim 5, wherein the first metal interconnection layer and the second metal interconnection layer are disposed within the peripheral circuit region.

7. A method for fabricating an image sensor, comprising:
    providing a semiconductor substrate having an active array region and a peripheral circuit region thereon, wherein a plurality of photosensor elements is disposed in the active array region;
    forming a first dielectric layer on the semiconductor substrate to cover the active array region and the peripheral circuit region;

forming a sacrificial layer pattern on the first dielectric layer within the active array region, wherein an angle between a sidewall of the sacrificial layer pattern and a top surface of the first dielectric layer is greater than 90 degrees;

forming a second dielectric layer on the first dielectric layer not covered by the sacrificial layer pattern; and removing the sacrificial layer pattern to expose a portion of the first dielectric layer.

8. The method according to claim 7, wherein said forming a sacrificial layer pattern further comprises:

forming a sacrificial layer on the first dielectric layer;

forming a photoresist pattern on the sacrificial layer; and performing an etching process to remove a portion of the sacrificial layer not covered by the photoresist pattern.

9. The method according to claim 7, wherein the sacrificial layer pattern comprises silicon oxynitride, amorphous carbon, or photosensitive polymeric materials.

10. The method according to claim 7, wherein said forming a second dielectric layer further comprises an atomic layer deposition (ALD) process or a low-temperature CVD process.

11. The method according to claim 7, wherein after forming the second dielectric layer, a portion of the second dielectric layer directly above the sacrificial layer pattern is removed by using a planarization process.

12. The method according to claim 7, wherein after removing the sacrificial layer pattern, the method further comprises forming a color filter film and a micro-lens structure on the exposed portion of the first dielectric layer.

* * * * *